(12) United States Patent
Capello et al.

(10) Patent No.: US 7,178,959 B2
(45) Date of Patent: Feb. 20, 2007

(54) ILLUMINATION ARRANGEMENT WITH REDUCED DEPTH FOR A VEHICLE HEADLIGHT

(75) Inventors: Davide Capello, Orbassano (IT); Piermario Repetto, Orbassano (IT); Pietro Perlo, Orbassano (IT)

(73) Assignee: C.R.F. Societa Consortile per Azioni (IT)

(*) Notice: Subject to any disclaimer, the term of this patent is extended or adjusted under 35 U.S.C. 154(b) by 0 days.

(21) Appl. No.: 10/910,376

(22) Filed: Aug. 4, 2004

(65) Prior Publication Data
US 2005/0030760 A1 Feb. 10, 2005

(30) Foreign Application Priority Data
Aug. 5, 2003 (IT) .................. TO2003A0610

(51) Int. Cl.
*F21S 2/00* (2006.01)
(52) U.S. Cl. ............ 362/545; 362/507; 362/240; 362/538
(58) Field of Classification Search ........... 362/545, 362/507, 543, 544, 237, 240, 244, 268, 310, 362/800, 538; 313/315, 316
See application file for complete search history.

(56) References Cited

U.S. PATENT DOCUMENTS 3,846,661 A * 11/1974 Brown et al. ............... 313/491

2001/0019486 A1 9/2001 Thominet

FOREIGN PATENT DOCUMENTS

| EP | 0 802 562 A2 | 10/1997 |
|---|---|---|
| EP | 20002611038 | 9/2000 |
| EP | 1 270 324 A2 | 1/2003 |
| EP | 1 418 629 A2 | 5/2004 |
| JP | 54016878 A * | 2/1979 |
| WO | WO 02/15287 A1 | 2/2002 |

* cited by examiner

Primary Examiner—Sandra O'Shea
Assistant Examiner—Sharon Payne
(74) Attorney, Agent, or Firm—Cook, Alex, McFarron, Manzo, Cummings & mehler, Ltd.

(57) ABSTRACT

An illumination arrangement for a vehicle headlight is formed of a plurality of contiguous elementary cells, each including a light source, defined by an emission surface having a horizontal dimension and a vertical dimension and capable of emitting a luminous flux, and an optical system capable of conveying the luminous flux at a predetermined solid angle about a predetermined direction. The elementary cells are disposed so as to generate overall a predetermined distribution of light emission. The horizontal dimension and the vertical dimension of the emission surface of the light sources are different. The vertical dimension is less than 1 mm and the ratio between the horizontal dimension and the vertical dimension is greater than 2.

12 Claims, 6 Drawing Sheets

# ILLUMINATION ARRANGEMENT WITH REDUCED DEPTH FOR A VEHICLE HEADLIGHT

BACKGROUND OF THE INVENTION

The present invention refers in general to vehicle headlights of the type comprising a plurality of light sources, for example LEDs, and in particular to an illumination arrangement for a vehicle headlight.

In the automobile sector, studies have been carried out for some time on new solutions for producing front and rear vehicle lights formed of matrices of LEDs (English acronym for "light-emitting diode") or other light emitting devices, so as to obtain more compact devices, in particular in terms of depth, and with new aesthetic content.

As is known, conventional road lights are based on a lamp type of light source, of the halogen or discharge type, and an optical system capable of forming a light distribution according to the regulations in force. The optical system may consist of a complex reflector with segments and of a smooth transparent element, or of a substantially parabolic reflector with a prismatic transparent element, or of a combination of complex reflector and prismatic transparent element.

In each case, the reflector or the transparent element are respectively intended to reflect and transmit the light emitted by the light source. The transparent element defines the surface for the outlet of the light beam from the headlight.

As is likewise known, according to the existing regulations, a motor vehicle headlight must generate on a measuring screen disposed at a predetermined distance therefrom a specific light distribution.

This distribution, in the case of a dipped headlight, has a rectangular shape with reduced vertical divergence (typically less than 15°) and a markedly greater horizontal divergence (typically 60°–70°).

The dimensions of the headlight are particularly critical for the dipped function, inasmuch as the light distribution must exhibit a very abrupt transition from maximum illuminance to practically zero illuminance at the optical axis of the headlight.

This constraint means that the luminous flux is predominantly concentrated in a part of the distribution having a vertical angle of divergence typically below 5° and a horizontal angle of divergence typically below 20°–30°. FIG. 1 illustrates that part of the light distribution in which the flux for a dipped headlight is concentrated according to the European regulations (the distribution is tilted horizontally in the case of traffic on the left). This region is represented by a system of cartesian axes having their origin disposed on the geometric axis of the headlight. As can be seen, this region is horizontally centred with respect to the system of cartesian axes, has a horizontal angle of divergence of 20°, and extends vertically from the horizontal axis x substantially below the latter, with a vertical angle of divergence of 3°, exhibiting in addition a vertical lateral extension contained between the axis x and an inclined segment disposed above the latter. Typically, 40–50% of the luminous flux falls in the region shown in FIG. 1: for example, in a good quality vehicle headlight with discharge lamp, of around 700 lumens of flux emitted overall by the headlight, around 300 lumens finish in that region, while the remaining 400 lumens finish both in a region of the light distribution with an angulation of more than 3° and positioned below the region of distribution of FIG. 1, and in a region with an angulation of more than 20° and positioned laterally with respect to the distribution of FIG. 1.

The dimensions of the outlet surface of conventional dipped headlights are very variable, as is also the depth: the depth in particular is bound by the fact that the linear dimension of the source, for example of the filament in the case of an incandescent lamp, is typically never less than 4 mm; in order to guarantee the photometric performances disclosed above and provided for by the regulations, the reflector must have a focal distance typically of not less than 80 mm. The selection of a long focal distance in dipped headlights is substantially linked to the need to maintain the vertical angle of divergence of the light distribution within an interval of a few degrees; in fact, with L the vertical semi-dimension of the source, and θ the maximum angle of semi-divergence admissible in the vertical direction, the focal distance F of the system is defined by the equation $F=L/\tan(\theta)$. The focal length F also restricts the dimension of the outlet cross-section of the headlight, inasmuch as the reflector must receive as much as possible of the flux emitted by the source.

A particularly compact version (in terms of outlet surface area) of a dipped headlight is the so-called "elliptical" headlight, consisting of an elliptical reflector which forms an image of the source; the abrupt cut-off in the distribution is in this case obtained by obscuring a part of the light emerging from the reflector through a diaphragm placed in proximity to the image of the source formed by the reflector. A final lens projects the image of the diaphragm in the far field forming the distribution provided for by the regulations. The presence of the diaphragm makes it possible to use reflectors with a smaller focal distance (and therefore forming images of the source of greater dimensions); the price paid is a greater depth of the reflector and a lesser efficiency (typically below 35%, as against the 70% and more of a conventional headlight of the non-elliptical type).

In order to obtain headlights with a lesser focal distance and therefore a lesser thickness, the only solution is to reduce the vertical dimension of the source, which can be done either by using sources with greater emittance (i.e. flux emitted by the unit of surface area), or by dividing the source into a multiplicity of sources of smaller vertical dimension, in such a manner that, with parity of emittance, the sum of the areas of the individual sources is equal to the surface area of the original source, thus obtaining the same overall flux.

A typical source for motor vehicle headlights is the halogen lamp, with a power of 55 W (for example the category H7 lamp), with a nominal flux greater than 1300 lumens and an equivalent emitting surface area greater than 20 $mm^2$, which is equivalent to an emittance of 65 $lm/mm^2$.

White LEDs currently have a maximum emittance of 18 $lm/mm^2$, although LEDs of up to 25 $lm/mm^2$ are beginning to be available commercially. It is thought that the white LED may in a few years reach the threshold of 40 $lm/mm^2$, owing to the rapid progress in the field of technology and of semiconductor junctions and of phosphors, as well as to the continuous improvements in packaging technology. The aim of the LED constructors is that of reaching, in the medium-long term, emittances of up to 100 $lm/mm^2$.

In the case of incandescent micro-sources of reduced dimensions, the solution of increasing the emittance cannot easily be pursued, inasmuch as the emittance of an incandescent source is bound by the operating temperature through the Planck law. Increasing the emittance means in practice raising the temperature of incandescence, which nowadays is already at limit values, compatibly with an acceptable average service life; however, up to now, halogen lamps still have an emittance 3–4 times higher than the white LED.

SUMMARY OF THE INVENTION

The aim of the present invention is to produce a vehicle headlight formed of a plurality of sources of small dimensions, capable of generating a light distribution compatible with the illumination standards in force.

This aim is achieved according to the invention by an illumination arrangement for a vehicle headlight having the characteristics defined in the claims.

Owing to such an arrangement, a vehicle headlight is capable of producing a light distribution compatible with the required standards of illumination, having at the same time a compact structure in which the light beam outlet surface has an area comparable to or less than that of the headlights currently marketed (generally less than 18000 mm$^2$) and the depth is markedly less than that of those headlights (for example less than 20 mm).

The sources used in such an arrangement may be both of the semiconductor type (white LEDs) and of the incandescent type (microfilaments). As will be appreciated, the dimensional limits claimed by the present invention are valid for all the sources of small dimensions currently marketed (white LEDs or microfilaments), and in general for sources having an emittance of up to 60 lm/mm$^2$.

BRIEF DESCRIPTION OF THE DRAWINGS

A description will now be given of some preferred but non-limiting embodiments of the invention, referring to the appended drawings, in which.

DETAILED DESCRIPTION OF THE INVENTION

Figure 2:
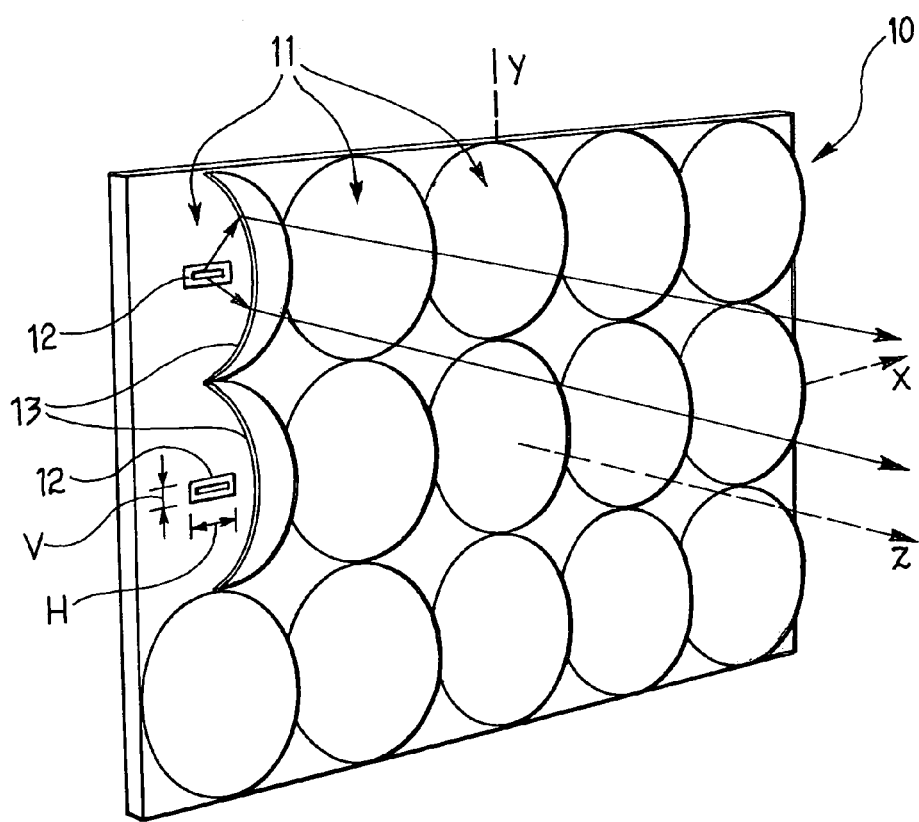
FIG. 2 is a diagrammatic perspective view of a headlight provided with the illumination arrangement according to the invention.

With reference to FIG. 2, a vehicle headlight 10 having an illumination arrangement according to the invention is illustrated. The headlight 10 is formed of a plurality of contiguous cells 11 disposed in a matrix. Each elementary cell 11 comprises a light source 12 of known type, for example a LED (organic or inorganic) or an incandescent microfilament, defined by an emission surface having a horizontal dimension H and a vertical dimension V, and capable of emitting a luminous flux. The elementary cell 11 further comprises an optical system 13 illustrated diagrammatically in the drawing as a circular lens, capable of conveying the luminous flux emitted by the source 12 at a predetermined solid angle about a predetermined direction.

Figure 3:
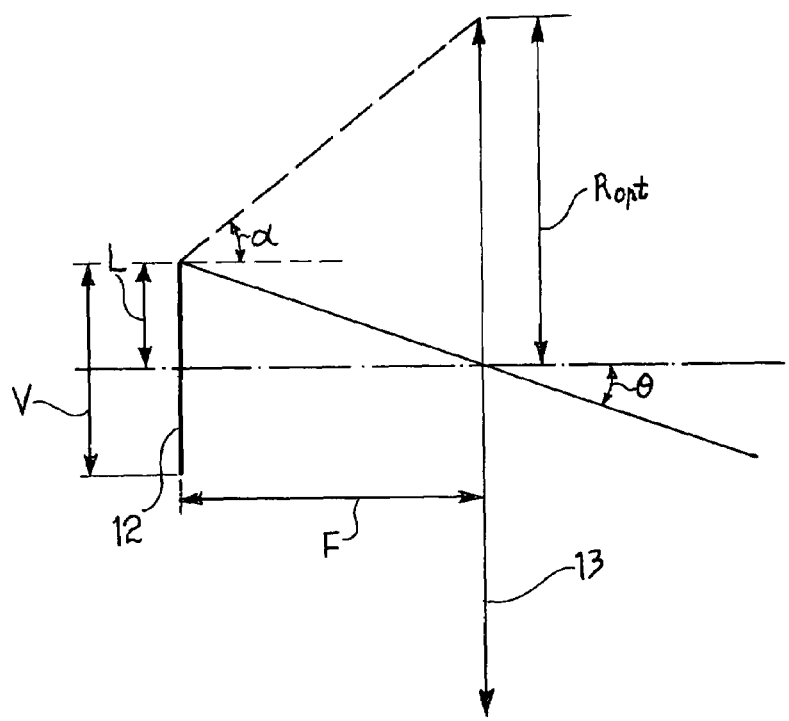
FIG. 3 is a plan of an optical system of the headlight of FIG. 2.

The optical system 13 may be any known optical system, for example of the type comprising an objective for the transmission of the luminous flux emitted by the source, or of the type comprising a reflector element for reflecting the flux, or a combination of the above. FIG. 3 shows diagrammatically the optical system in transmission of the headlight in FIG. 2. The optical system 13 is composed of the circular lens 11 having a radius $R_{opt}$ and a focal distance F, and angle of semi-divergence θ. The vertical dimension V of the light source 12 is equal to 2 L, with semi-aperture of the lens 11 equal to α.

Figure 1:
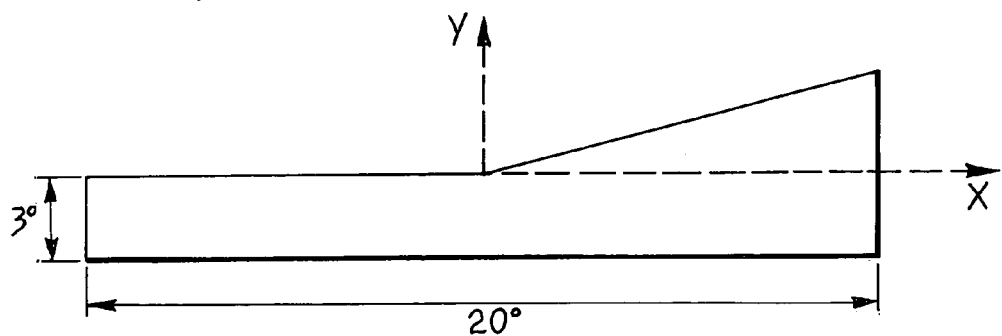
FIG. 1 is a diagram which represents diagrammatically a portion of the light distribution generated by a dipped headlight according to the European standard.

The light distribution to be obtained is that indicated in FIG. 1, which exhibits a vertical divergence θ (along the axis y) of 3°, a horizontal divergence (along the axis x) of 20°, and an incident flux ($\Phi_{eff}$) of around 300 lm. Let $A_{eff}$ be the area of the outlet cross-section of the light beam of the headlight responsible for the formation of the distribution of FIG. 1.

The remainder of the headlight will be responsible for the formation of the remainder of the distribution (located below the distribution shown in FIG. 1). Since the latter is in general disposed at a greater vertical angle (more than 3 degrees), the light sources dedicated to this part of the distribution will in general have optics having a shorter focal distance and therefore a smaller outlet surface area. It may be assumed in general that, if $A_{eff}$ is the area necessary for the formation of the distribution in FIG. 1, the surface area necessary for the formation of the remainder of the distribution will be as a first approximation less than $A_{eff}/2$.

As is known, the focal distance F of the optical system of a headlight is given by the formula $$F = L/\tan(\theta), \qquad (1)$$

where L is the vertical semi-dimension of the light source, and θ is the angle of vertical semi-divergence of the light beam emitted.

The radius of the optics $R_{opt}$, or in the present example the radius of the circular lens 13 of the individual cell 11, is given by the formula $$R_{opt} = F \cdot (\tan(\alpha) + \tan(\theta)) \qquad (2).$$

Considering the outlet cross-section of the luminous flux defined by the circular lens 11, the area A of the outlet cross-section for an individual elementary cell 11 is given by the formula $A = \pi R_{opt}^2$, while with a plurality of sources 12, and therefore of cells 11, equal in number to $N_{eff}$, the overall area $A_{tot}$ of the outlet cross-section of the headlight 10 is given by $A_{tot} = A \cdot N_{eff}$.

With the preceding formulas known, it is possible according to the invention to express the vertical dimension V of the individual light source 12 in dependence on the overall area $A_{tot}$ of the outlet cross-section of the headlight, the number of micro-sources $N_{eff}$, the angle of divergence $\theta$ of the light distribution to be obtained, and the angle of aperture $\alpha$ of the luminous flux emerging from the source 12:

$$V = 2L = \frac{\sqrt{\frac{A_{tot}}{\pi N_{eff}}}}{\tan(\alpha) + \tan(\theta)} \tan(\theta) \quad (3)$$

It is further possible to express the horizontal dimension H of the individual light source 12 in dependence on its vertical dimension V, the number of micro-sources $N_{eff}$, the emittance E of the individual source 11, and the total flux $\Phi_{tot}$ emitted overall by the micro-sources 12, according to the formula:

$$H = \frac{\Phi_{tot}}{E} \frac{1}{V N_{eff}} \quad (4)$$

The overall area S formed by the sum of the surfaces of the approximately rectangular micro-sources 12 is therefore given by the formula:

$$S = \frac{\Phi_{tot}}{E} = N_{eff} HV \quad (5)$$

Figure 4:
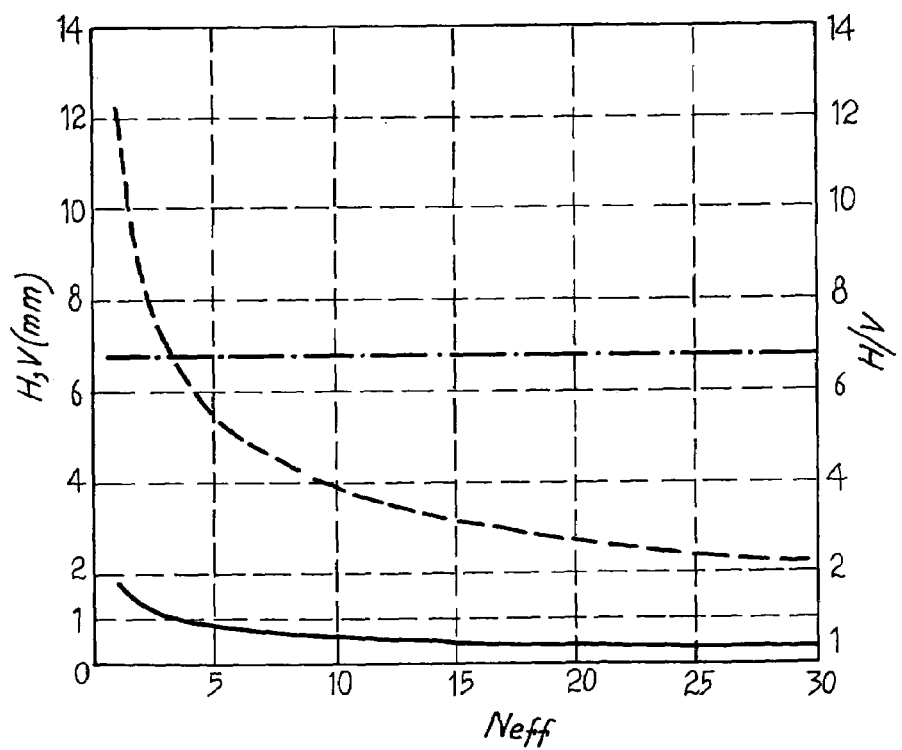
FIG. 4 is a graph which represents the variation of the dimensions of the sources of the headlight in dependence on their number, with an outlet area of the light beam of the headlight equal to 12000 mm$^2$ and emittance of the sources equal to 18 lm/mm$^2$.

FIG. 4 shows the vertical dimension V (continuous line), the horizontal dimension H (dashed line) and the H/V ratio (dash-dotted line) in dependence on the number $N_{eff}$ of sources 12. In the graph of FIG. 4, the value of the emittance E has been selected as equal to 18 lm/mm², that is a typical value for present-day white LEDs, while the total area $A_{tot}$ of the outlet cross-section of the headlight has been selected as equal to 12000 mm². Typically, the area $A_{tot}$ of the outlet cross-section of the headlight ranges between about 12000 mm² and about 18000 mm². The angle of semi-divergence $\theta$ is 3°, that is the angle of divergence typical of the standard distribution of FIG. 1, while the angle of semi-aperture $\alpha$ of the lens 13 is 60°, that is the angle at which 75% of the flux emitted overall by the source 12 is emitted, having a typical emission lobe with a lambertian variation. The total flux $\Phi_{tot}$ is therefore equal to the flux $\Phi_{eff}$ which it is wished to obtain in the light distribution illustrated in FIG. 1, divided by 0.75.

The value of the angle of semi-aperture $\alpha$ of 60° is a typical value for optimising the selection of the semi-aperture of the lens 13. As is in fact known, the complexity of a lens increases as the ratio between focal distance and diameter of that lens decreases, and therefore, with parity of the focal distance, as the diameter of the lens increases. On the other hand, the more the diameter of the lens is reduced, the more the luminous flux received by the lens is reduced. Therefore, the value of the angle of semi-aperture $\alpha$ for balancing the requirements of illumination and the requirements of complexity, and therefore economic requirements, must be opportunely selected to be close to 60°.

Figure 5:
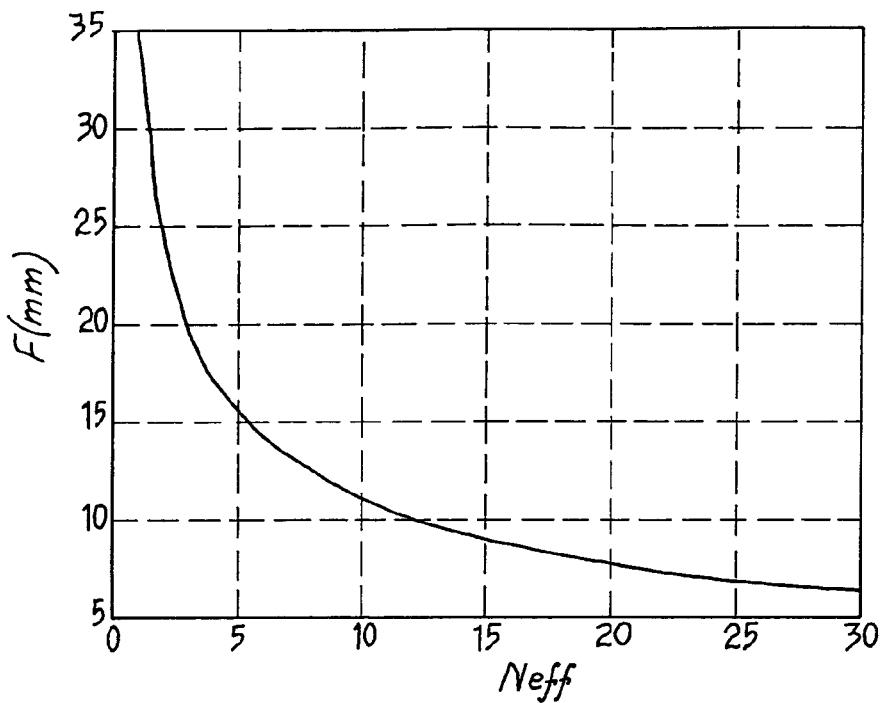
FIG. 5 is a graph which represents the variation of the focal distance of the headlight, with an outlet area of the light beam equal to 12000 mm$^2$, in dependence on the number of sources.

FIG. 5 shows the focal distance F in dependence on the number $N_{eff}$ of sources, still with an overall area $A_{tot}$ equal to 12000 mm².

By selecting, for example, a number of LEDs $N_{eff}$ equal to 22, the vertical dimension of the micro-sources will be 400 µm, while the horizontal dimension will be 2.6 mm. The focal distance will be 7.6 mm.

By adding to the total area $A_{tot}$ of the outlet cross-section of the headlight (in the present example equal to 12000 mm²) an additional area equal to $A_{tot}/2$, or to 6000 mm², necessary for producing the remainder of the light distribution, the overall area of the outlet cross-section of the headlight becomes equal to 18000 mm². With a headlight having a single source of conventional type, that area implies a diameter of the optics of 150 mm, and therefore a focal distance of the headlight of about 80 mm.

A headlight comprising an illumination arrangement according to the invention therefore exhibits a reduction in the depth of the headlight itself, while maintaining an area of the outlet cross-section of the headlight substantially comparable to that of the conventional headlight with a single source.

Considering, instead, a headlight formed of a plurality of LED sources having a square shape with a surface having an area substantially equal to that of the preceding example, and therefore with a flux emitted by the single source substantially equal to that of the example according to the invention, the horizontal dimension of each source will be equal to its vertical dimension and equal to about 1 mm. With parity of the other conditions, in order to obtain the same value of $\Phi_{eff}$ equal to 300 lumens, with an emittance equal to the typical value of 18 lumens/mm² (and therefore a flux $\Phi_{led}$ emitted by the single LED equal to 18 lumens), the number of LEDs necessary will be about 22, in fact:

$N_{eff} = \Phi_{eff}/((0.75\Phi_{led})) \sim 22 \text{led}$

On the basis of formulas (1) and (2), the focal distance F will be 47.7 mm, while the radius of the optics $R_{opt}$ will be 83 mm, with an overall area $A_{tot}$ equal to 486000 mm², equal to almost 30 times the area of a headlight with a bulb source and having a circular cross-section with a diameter of 150 mm.

From FIG. 5 it will further be deduced that in order to have a headlight having a thickness of less than 20 mm, the minimum number of sources necessary is greater than 2; for $N_{eff} > 2$, moreover, the vertical dimension V of the source is less than 1 mm, while the H/V ratio is always more than 6 (see FIG. 5).

Figure 6:
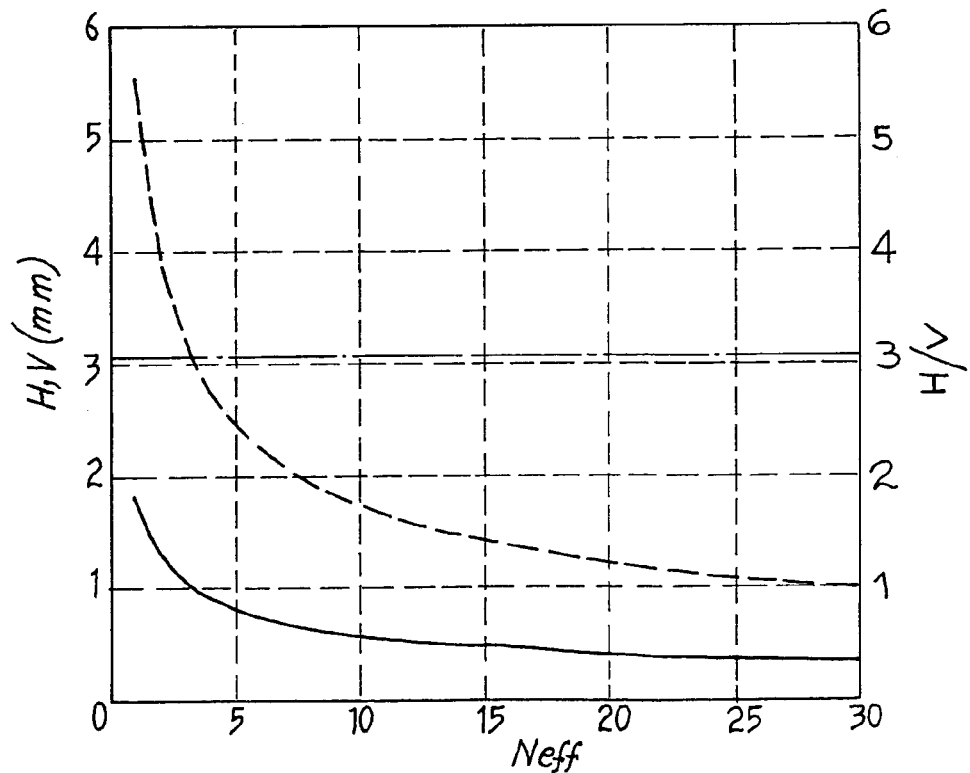
FIG. 6 is a graph which represents the variation of the dimensions of the sources of the headlight in dependence on their number, with an outlet area of the light beam of the headlight equal to 12000 mm$^2$ and emittance of the sources equal to 40 lm/mm$^2$.

FIG. 6 shows the same magnitudes as FIG. 4, but with emittance values equal to 40 lm/mm². As can be seen, the H/V ratio is more than 3. Similarly, it is possible to demonstrate that such a ratio remains more than 2 up to emittance values equal to 60 lm/mm², that is those obtainable at maximum with the sources of small dimensions that are currently known.

As may be appreciated, the shape of the sources need not necessarily be the rectangular shape described in the preceding examples, but for their emission surface area it is sufficient for it to be possible to define a horizontal and a vertical dimension. For example, the surface may be elliptical or rhomboidal, or may be in the form of an irregular polygon.

Figure 7:
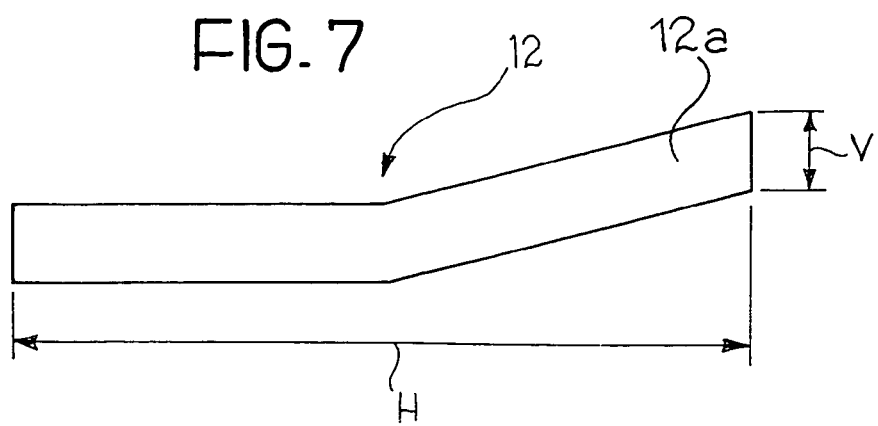
FIGS. 7 and 8 are diagrammatic plan views of variants of light sources used in the illumination arrangement according to the invention.
Figure 8:
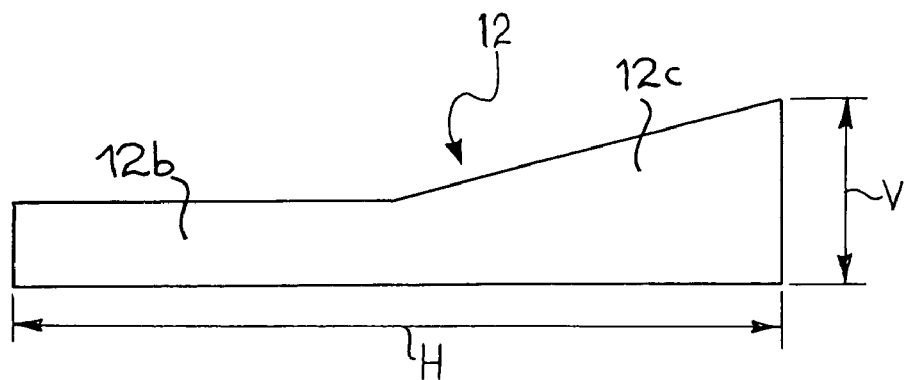

In particular, variants of the rectangular shape of the light sources 12 are illustrated in FIGS. 7 and 8. In FIG. 7, the light source 12 is in the shape of a 6-sided horizontally elongate polygon, having a constant vertical dimension over its length with a portion 12a inclined with respect to the horizontal direction. In FIG. 8, the light source 12 is in the shape of a 5-sided horizontally elongate polygon, having a portion 12b with constant vertical dimension, starting from which there extends a portion 12c having a vertical dimension increasing in the horizontal direction. The inclined portion 12a of the 6-sided polygon and the portion 12c, having an increasing vertical dimension, of the 5-sided polygon serve to give rise to the inclined section of the cut-off line of the light distribution according to the European standard. In this way it is possible to provide a particularly simple, or smooth, transparent element of the headlight, since with these variants the transparent element need no longer direct part of the luminous flux in the inclined section below the cut-off line. In the aforesaid variants, the horizontal dimension H and the vertical dimension V of the source 12 are respectively defined as the maximum dimension in the horizontal direction and as the maximum dimension in the vertical direction of the corresponding polygon.

In the case of incandescent sources, the aforesaid shapes may be obtained by means of simple deformation of the metallic filament having a circular or rectangular cross-section.

Figure 9:
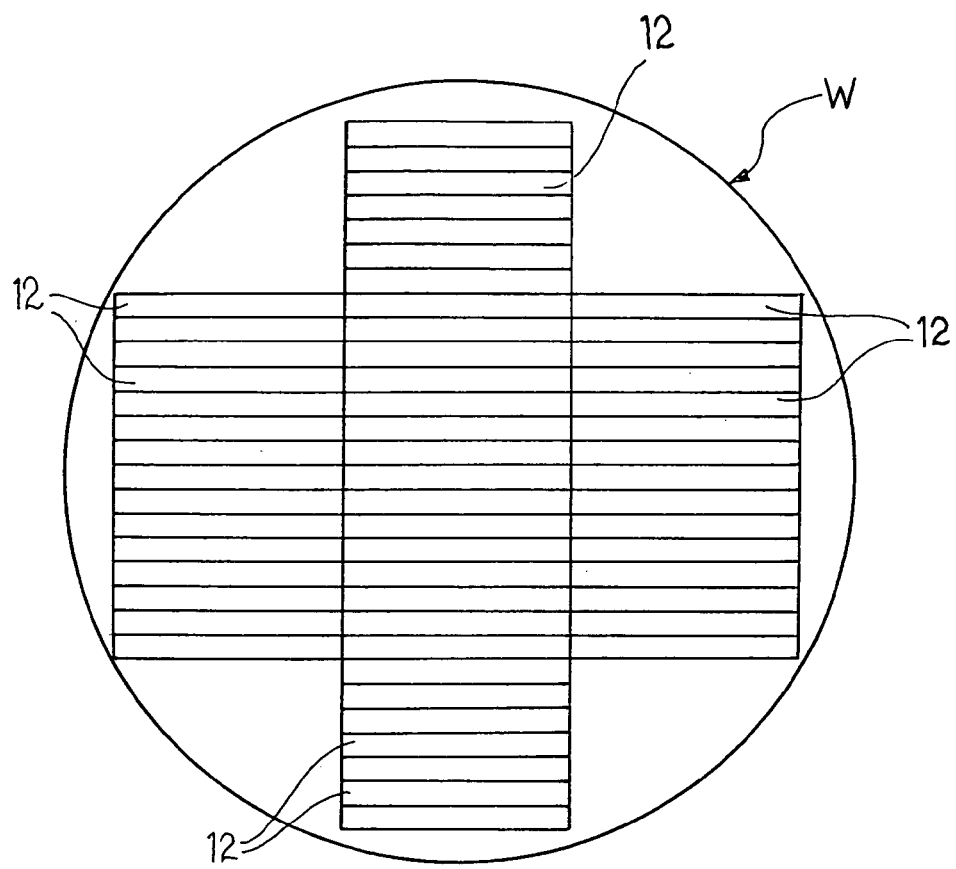
FIGS. 9 to 11 are diagrammatic plan views of semiconductor wafers on which are produced variants of semiconductor light sources, in a manufacturing stage.
Figure 10:
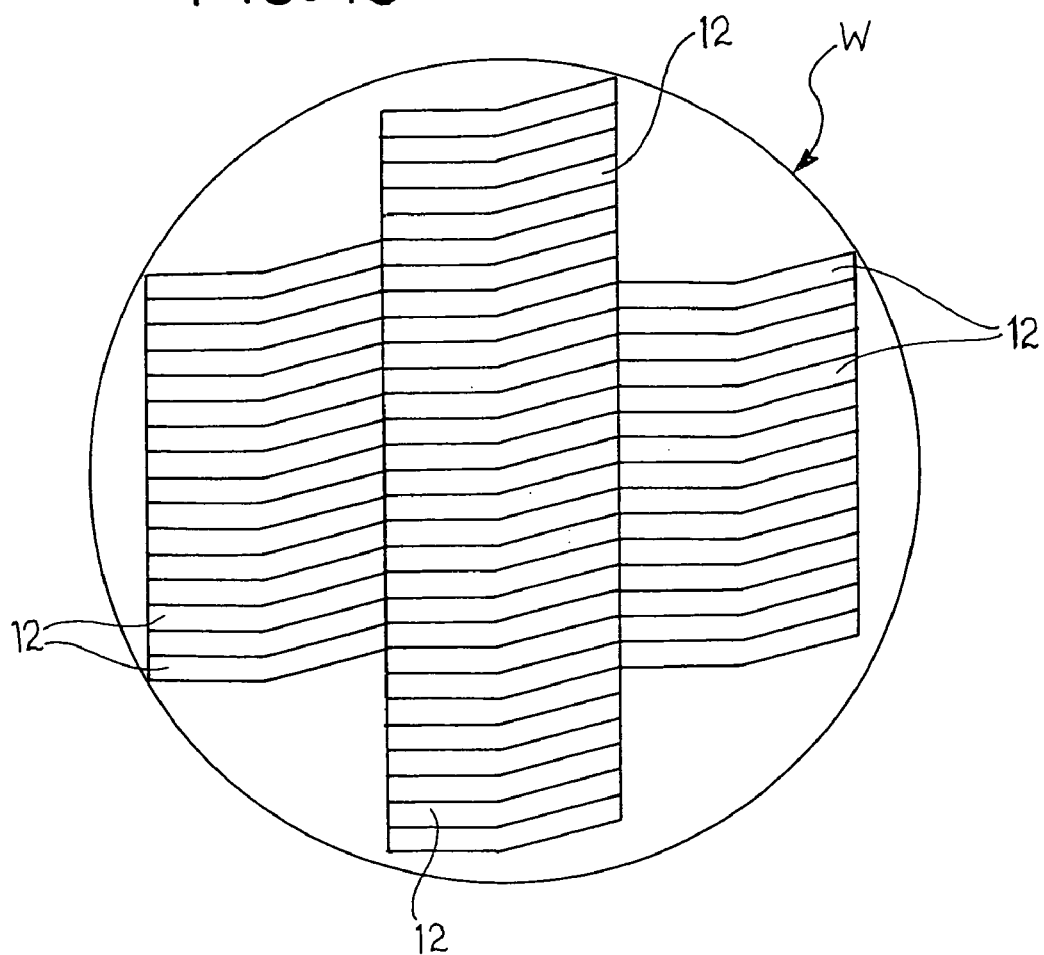
Figure 11:
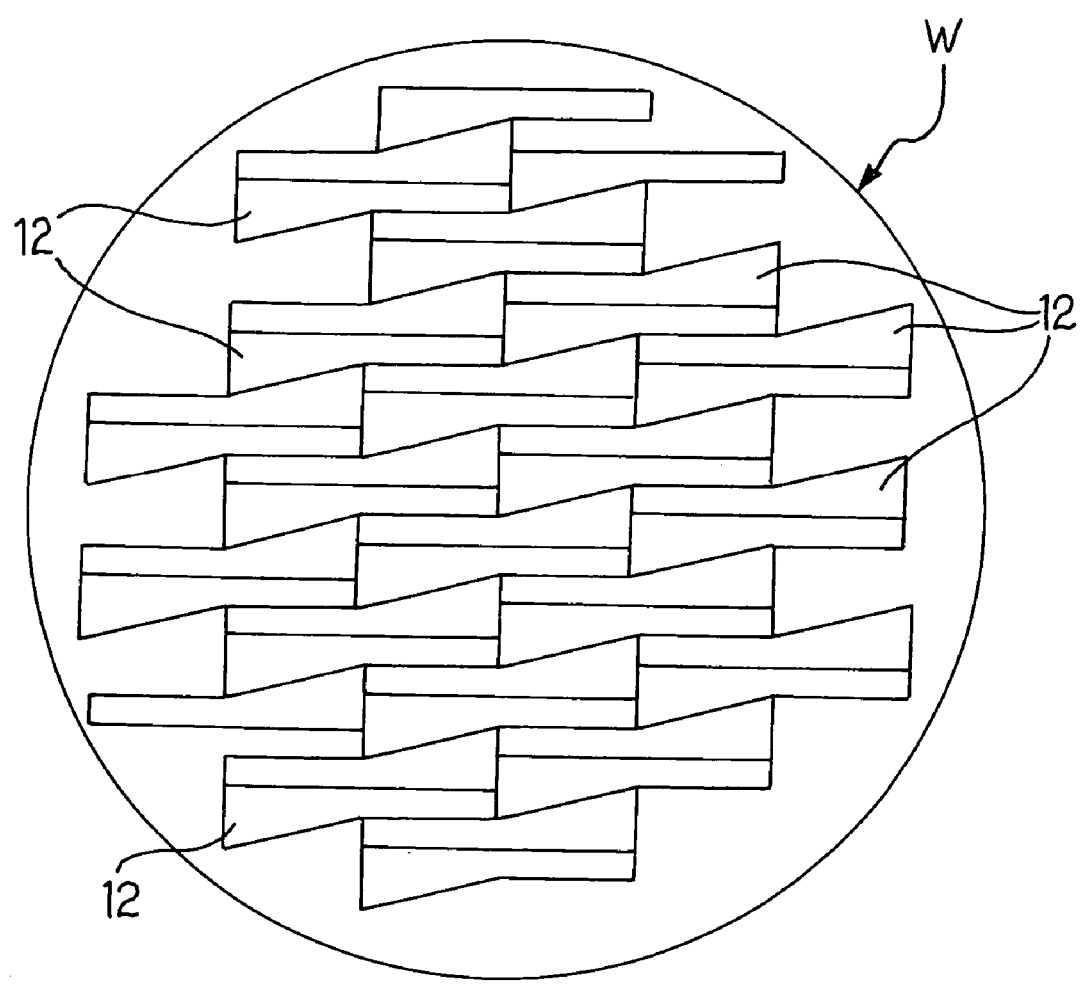

In the case of semiconductor sources, as is illustrated in FIGS. 9 to 11, such sources may be produced in a known manner, for example by means of deposition of a certain number of layers, on a single substrate wafer W, for example of silicon. The stratified structures thus obtained are then re-cut into repeat units so as to be able to complete the manufacture of the semiconductor sources. In particular, the rectangular shapes and 5-sided and 6-sided polygonal shapes described above make it possible to minimise the waste portion of wafer W by means of suitable sub-division of the surface of the wafer W into the repeat units intended to form the sources.

As may be appreciated, although the present description has been provided with reference to an optical system in transmission and to a standard light distribution of the European type, the invention may also be used with an optical system in reflection or with a combination of transmission and reflection, and/or with reference to a standard light distribution of the American type.

With the principle of the invention remaining unchanged, the details of production and the embodiments may of course be widely varied with respect to what has been described and illustrated, without thereby departing from the scope of the invention.

What is claimed is:

1. A headlight for road vehicles comprising an illumination arrangement, the illumination arrangement being formed of a plurality of contiguous elementary cells, each comprising a light source, defined by an emission surface having a horizontal dimension and a vertical dimension and capable of emitting a luminous flux, and an optical system capable of conveying said luminous flux at a predetermined solid angle about a predetermined direction, said elementary cells being disposed so as to generate overall a predetermined distribution of light emission, wherein the emission surface of each light source is in the shape of a horizontally elongate polygon, said polygon being constituted by a horizontally extending portion, having a vertical width which is constant along the horizontal direction, and an inclined cut-off generating portion, which extends from one end of the horizontally extending portion and has an upper side which is inclined to the horizontal, and wherein the horizontal dimension of the emission surface is defined as its maximum width in the horizontal direction and the vertical dimension of the emission surface is defined as its maximum width in the vertical direction, the vertical dimension being less than 1 mm and the ratio between the horizontal dimension and the vertical dimension being greater than 2.

2. A headlight according to claim 1, wherein the horizontal dimension is more than 2 mm, and the vertical dimension is less than 0.5 mm.

3. A headlight according to claim 1, wherein the individual sources are in the shape of a 6-sided horizontally elongate polygon, and the inclined cut-off generating portion is a portion being inclined with respect to the horizontal direction and having a vertical width which is constant along the horizontal direction.

4. A headlight according to claim 1, wherein the individual sources are in the shape of a 5-sided horizontally elongate polygon, and the inclined cut-off generating portion is a portion with a vertical width which varies along the horizontal direction to the vertical dimension.

5. A headlight according to claim 1, wherein the light sources of the elementary cells are produced from inorganic or organic semiconductor material, capable of emitting light when electrically stimulated.

6. A headlight according to claim 5, wherein the light sources are LEDs.

7. A headlight according to claim 5, wherein the individual semiconductor sources are produced from a semiconductor wafer, then sub-divided into individual repeat units of the desired dimension and shape, so as to minimise wastage of the material of the wafer.

8. A headlight according to claims 1, wherein the light sources of the elementary cells are produced from metallic material capable of emitting by incandescence.

9. A headlight according to claim 8, wherein the shape of the source is obtained by simple deformation of a metallic filament of circular or rectangular cross-section.

10. A headlight according to claim 1, wherein said elementary cells are disposed in a matrix.

11. A headlight according to claim 1, wherein said optical system comprises at least one lens for the transmission of the light beam.

12. A headlight according to claim 1, wherein said optical system comprises a reflector for reflecting the light beam.

* * * * *